United States Patent [19]
von der Broeck

[11] Patent Number: 5,146,400
[45] Date of Patent: Sep. 8, 1992

[54] CIRCUIT ARRANGEMENT FOR PRODUCING CURRENT PULSES OF A GIVEN SHAPE IN AN INDUCTIVE LOAD

[75] Inventor: Heinz von der Broeck, Zulpich, Fed. Rep. of Germany

[73] Assignee: U.S. Philips Corp., New York, N.Y.

[21] Appl. No.: 573,438

[22] Filed: Aug. 27, 1990

[30] Foreign Application Priority Data

Aug. 26, 1989 [DE] Fed. Rep. of Germany ........ 3928281

[51] Int. Cl.$^5$ ............................................ H02M 7/537
[52] U.S. Cl. ........................................ 363/98; 363/132
[58] Field of Search ...................... 363/98, 132, 95, 97

[56] References Cited

U.S. PATENT DOCUMENTS 4,820,986 4/1989 Mansfield et al. ................. 363/98 X

*Primary Examiner*—Emanuel T. Voeltz
*Attorney, Agent, or Firm*—Jack D. Slobod

[57] ABSTRACT

A circuit arrangement for producing in an inductive load, especially a gradient coil for nuclear magnetic resonance tomography, a current pulse of trapezoidal shape, applies a series of supply voltage pulses, some of positive and some of negative polarity, via an auxiliary inductor to a parallel arrangement of the load and oppositely directed current drains, which are controlled by respective associated control elements. Each applied supply voltage pulse produces a variation of current through the parallel arrangement during the voltage pulse which is more steep than the leading or trailing edge of the current pulse through the load. The durations and spacings of the voltage pulses are such that the current through the parallel arrangement is larger than the current through the load in a first interval spanning the entire leading edge and constant current portion of the current pulse and is smaller than the current through the load throughout a second interval spanning the trailing edge of the current pulse, except for points at the very beginning and very end of these intervals at which the current through the parallel arrangement equals the current through the load. The difference between the current through the parallel arrangement and the current pulse through the load is passed by the applicably directed current drain under control of the respective control element.

10 Claims, 2 Drawing Sheets

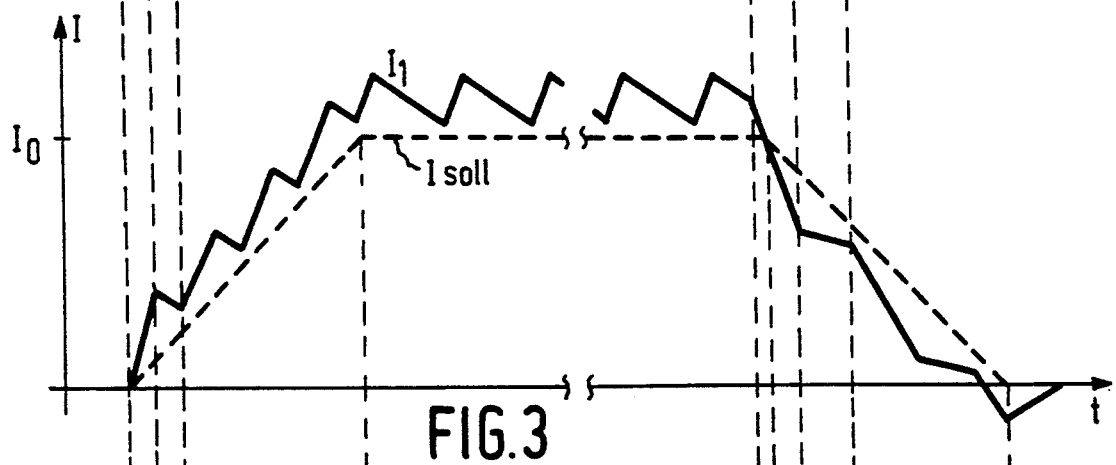
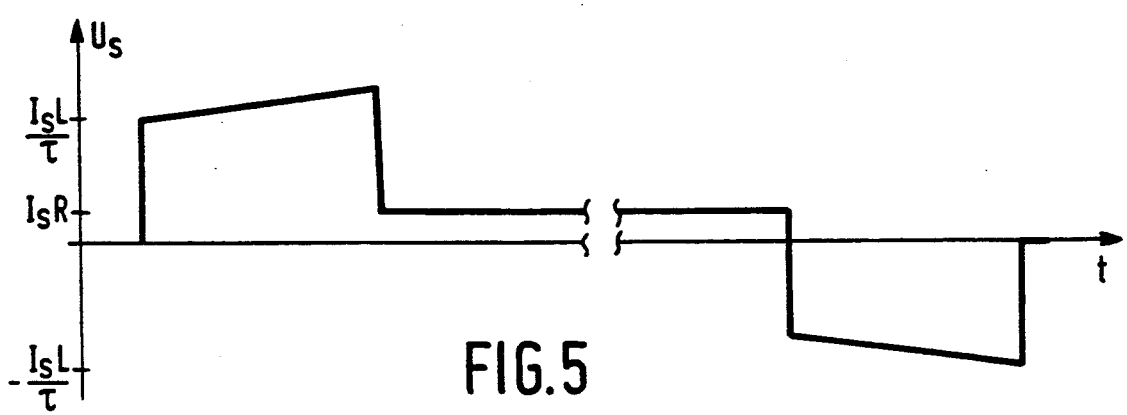

CIRCUIT ARRANGEMENT FOR PRODUCING CURRENT PULSES OF A GIVEN SHAPE IN AN INDUCTIVE LOAD

BACKGROUND OF THE INVENTION

1. Field of the Invention

The invention relates to a circuit arrangement for producing current pulses of a given shape in at least one inductive load, more particularly a gradient coil for nuclear magnetic resonance tomography, with the use of a supply voltage.

2. Description of the Related Art

If a current pulse of a given shape and amplitude having a high edge steepness should be produced in an inductive load, the value of the supply voltage required to this end is determined in accordance with that voltage which is required to obtain a current increase or current decrease. In the time periods in which a constant current flows through the coil, on the contrary a considerably smaller voltage is required. Consequently, the problem arises that the supply voltage for the current increase or current decrease must be chosen to be very large.

In the circuit arrangements according to the prior art, in series arrangement with the inductive load mostly series regulators are connected, in general transistors, by means of which the required flow of current is adjusted. The difference between the supply voltage and the voltage at the inductive load in this series regulator decreases and leads to high losses. This holds especially during the time periods in which a constant flow of current should be adjusted, because especially during these time periods the supply voltage itself is considerably larger than is required.

According to the prior art, further a second solution is known, in which the supply voltage either can be changed over to different values or in which a combinatorial circuit part is provided in order to continuously adapt the supply voltage required. However, in both cases, always a sufficient voltage reserve for the series regulators must be ensured. In the solution with different voltages (for example EP 0 250 718 A1) which corresponds to U.S. Pat. No. 4,733,342, many switches and voltage sources are required, which must all be designed for the maximum current, which renders the circuit arrangement much more complicated. Also in circuit arrangements using this solution, still high losses occur.

SUMMARY OF THE INVENTION

The invention has for its object to further improve the efficiency in circuit arrangements of the kind mentioned in the opening paragraph.

For such circuit arrangements, this object is achieved in that in series arrangement with the load an auxiliary inductor is connected and in parallel arrangement with the load at least one current drain is connected, which can be controlled by means of control elements, the supply voltage can be applied by means of the circuit arrangement in pulsatory form and with the polarity required to the series arrangement, the supply voltage is pulsed in such that the current through the parallel arrangement is larger than the desired nominal current through the load during leading pulse edge portion of the nominal current of the load and during a constant portion of time nominal current of the load but is smaller than the nominal current through the load during a trailing pulse edge portion of the nominal current of the load, and such a current is passed by means of the control elements through the current drain that the current through the load has its nominal vale.

In this solution according to the invention, the supply voltage has a constant value and can be applied by means of the circuit arrangement in both polarities to the inductive load. Of course the voltage source may also be completely switched off. The supply voltage is applied in pulsatory form and is therefore switched off in the meantime.

In parallel with the inductive load at least one controllable current drain is provided. The term "controllable" means in this connection that the current flowing through the current drain is externally controllable.

The supply voltage pulsed in the manner described above is applied to the series arrangement of an auxiliary inductor and this parallel arrangement comprising the inductive load and the current drain or drains. Since the supply voltage is applied in pulsatory form, the overall current through the parallel arrangement has a triangular shape.

However, it should be noted that the current through the parallel arrangement is always larger than the desired or nominal current of the load during the leading pulse edge portion of the nominal current of the load and during a constant portion of the nominal current of the load. Further, during the trailing pulse edge portion of the nominal current of the load the current through the parallel arrangement should always be smaller in absolute value than the nominal current of the load. With a pulse of the nominal current of the load having a positive polarity, during the leading edge portion, which rises and during the constant portion at the top of this pulse, the current through the parallel arrangement should always be larger than the nominal current of the load. During the trailing edge portion of this positive pulse, on the contrary the actual current through the parallel arrangement should always be smaller than the nominal current of the load. Conversely, with a pulse of the nominal current of the load having a negative polarity it should be noted that during the leading edge portion which falls, the current through the parallel arrangement is always larger value and therefore has a higher negative value more negative than the nominal current of the load. This also applies to that time period during which the nominal value of the load current is constant. During the trailing edge portion of the negative pulse, on the contrary the current through the parallel arrangement should have a less negative value than the nominal current of the load.

In these conditions it should be taken into account that especially at the transition from a constant portion nominal current of the load to a trailing edge of a pulse of the nominal current of the load these conditions cannot always be maintained for a short time because, as the case may be, the current through the inductor load, because it is inductive does not vary at this transition so rapidly that at the beginning of the trailing edge portion the current through the parallel arrangement is already smaller than the nominal current of the load. However, in these cases, the supply voltage must be pulsed in such a manner that the situation aimed at is reached as quickly as possible.

The auxiliary inductor provided in series with the parallel arrangement especially serves to take up the A.C. component of the pulsed supply voltage.

The difference between the current flowing through the parallel arrangement and the nominal current through the inductive load is passed through the current drain. Thus, a current equal to the nominal value flows through the inductive load.

The circuit arrangement according to the invention has with respect to the circuit arrangement according to the prior art a considerably improved efficiency. At the values of the current used especially for gradient coils for nuclear magnetic resonance tomography of a few hundred amperes, this is a substantial improvement.

The improvement is mainly due to the fact that the supply voltage need no longer be controlled, but is applied in pulsatory form through the auxiliary inductor to the load. Therefore, series regulators or the like are no longer required, but electronic switches may be used, which have a high efficiency. The current drain is loaded with only comparatively small currents so that also the losses now occurring are comparatively low. Moreover, the voltage decrease in this current drain is comparatively small, especially at a constant current.

Because of the lower losses, the circuit arrangement according to the invention requires less cooling means and therefore can be constructed more compactly.

According to a further embodiment, it is ensured that the supply voltage can be applied by means of electronic switches controlled by a control circuit in the required polarity in pulsatory form to the series arrangement of the auxiliary inductor and the parallel arrangement and that the control circuit has supplied to it for determining the required polarity and pulse width a difference signal from the nominal current of the load and the actual current through the parallel arrangement as well as a signal which indicates, as the case may be, the sign of the current variation just occurring in the load. The supply voltage can be applied by means of transistors, which operate in a pure switching mode. Comparatively low losses then occur. The width and the relative distance of the pulses are determined and controlled by means of a control circuit. In order to determine the required pulses the difference between the overall current flowing through the parallel arrangement and the nominal current through the load is supplied to the control circuit. Moreover, the control circuit receives a signal which indicates the sign of desired current variation in the load, which corresponds to the polarity of supply voltage to be applied. In the form of these two input signals the control circuit can apply the supply voltage in pulses in such a manner to the series arrangement of the auxiliary inductor and the parallel arrangement that the aforementioned conditions are always satisfied.

According to a further embodiment of the invention, it is ensured that the signal indicating the sign of desired current variation indicates the transition from the constant current portion to the load to a trailing edge portion of a pulse of nominal current of the load so early in time that at the beginning of the trailing edge portion the current through the parallel arrangement is already smaller than the nominal current of the load.

As already stated above, at the transition from a constant nominal current portion to a trailing edge portion problems can arise in that at the beginning of the trailing edge the current through current through the parallel arrangement, being larger than the nominal current of the load during the time of the constant nominal current portion, cannot be smaller than the nominal current of the load at the beginning of the trailing edge portion. However, in order to satisfy the last-mentioned requirement, the signal indicating the sign of the desired current variation provides an already early indication of a transition from a constant current portion to a trailing edge portion of a pulse of the nominal current of the load. Consequently, by means of the circuit arrangement the pulsed supply voltage is generated in a required manner that the polarity of the supply voltage is changed somewhat earlier than the beginning of the trailing edge portion of the nominal current of the load to allow the actual current through the parallel arrangement to approximately equal the nominal current of the load at the very beginning of the trailing edge portion.

According to a further embodiment of the invention, it is ensured that the control elements in the current drain(s) constitute electronic regulators, to which the difference signal between the nominal current of the load and the actual current through the parallel arrangement is supplied and which in dependence upon this signal influence for the value of the current flowing through the current drain(s).

Suitable control elements in the current drain or drains are electronic regulators, i.e. therefore especially transistors, which are preferably field effect transistors, which are controlled in dependence upon the aforementioned difference signal, as a result of which the current flowing through the current drain is influenced in a desired manner.

According to a further embodiment, it is ensured that two current drains are provided, which each have a diode, which diodes are connected so that for each direction of current flow each time only one current drain is operative.

If as control elements in the current drains use is made of transistors, in this circuit arrangement usually current can flow only in one direction. Therefore, two current drains are provided, which are arranged in parallel opposition.

According to a further embodiment of the invention, it is ensured that, in order to maintain the function of the control elements, a voltage source is provided at a low voltage decreasing at the load in each of the current drains. Thus, the current drains operate also at comparatively low voltages decreasing at the load. They can be used even at small negative load voltages and then act as a current source.

BRIEF DESCRIPTION OF THE DRAWING

In order that the invention may be readily carried out, it will now be described more fully, by way of example, with reference to the accompanying drawing, in which:

FIG. 2 to FIG. 5 show voltage or current diagrams for the circuit arrangement shown in FIG. 1.

BRIEF DESCRIPTION OF THE PREFERRED EMBODIMENT

Figure 1:
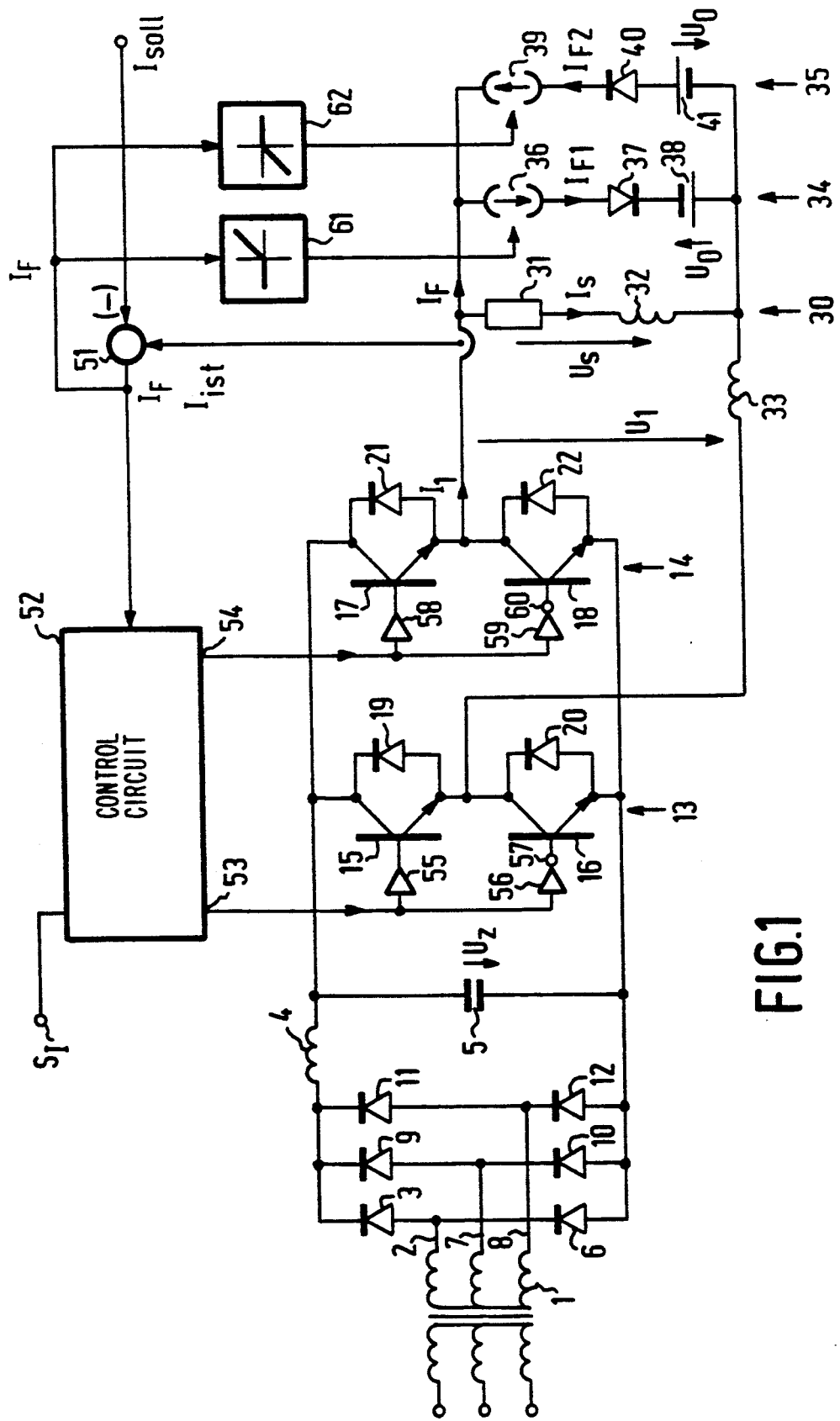
FIG. 1 shows a circuit arrangement for producing current pulses in an inductive load.

In the circuit arrangement shown in FIG. 1, the supply voltage is produced by means of a three-phase current transformer 1, whose output voltage is rectified. The first phase 2 on the secondary side of the transformer 1 is connected through a diode 3 and an inductor 4 to an electrode of the capacitance 5, whose outer electrode is also connected through a further diode 6 to the phase 2 on the secondary side of the three-phase current transformer 1. The diodes 3 and 6 are then connected so that the anode of the diode 3 and the cathode of the diode 6 are connected to the secondary phase 2 of the transformer.

The three-phase current transformer 1 further comprises a second secondary winding 7 and a third secondary winding 8. The second secondary winding 7 is connected in the same manner as the first secondary winding 2 through diodes 9 and 10 and the inductor 4 to the capacitance 5. The same applies to the third secondary phase 8 with respect to diodes 11 and 12.

The capacitance 5 is charged by this rectifier circuit. The approximately constant supply voltage $U_z$ can then be derived at the capacitance 5.

Two transistor branches 13 and 14 are connected parallel to the capacitance 5. The first transistor branch 13 has a first transistor 15 and a second transistor 16. The collector of the transistor 15 is connected to the first electrode of the capacitance 5. The emitter of the transistor 15 is connected to the connector of the transistor 16, whose emitter is connected to the other electrode of the capacitance 5.

In the same manner, two transistors 17 and 18 of the second transistor bridge 14 are connected in the same manner.

All four transistors 15, 16, 17 and 18 are provided with diodes 19, 20, 21 and 22, whose cathodes are connected to the collectors and whose anodes are connected to the emitters of the respective transistors. These diodes serve as fly-back diodes.

The junction point between the emitter of the transistor 17 and the collector of the transistor 18 is connected to an inductive load 30, which is represented in the circuit diagrams shown in FIG. 1 by an ohmic resistor 31 and an inductor 32. This load is connected through a further external auxiliary inductor 33 to the junction point between the emitter of the transistor 15 and the collector of the transistor 16.

Two current drains 34 and 35 are connected parallel to the inductive load 30, i.e. to the series arrangement comprising the ohmic resistor 31 and the inductor 32. The first current drain 34, which is provided for a current flow from the bridge comprising the transistors 17 and 18 to the bridge comprising the transistors 15 and 16, has an electronic control element 36, a diode 37, whose anode is connected to the electronic control element 36, and a voltage source 38.

The second current drain 35 is provided for a current flow in the reverse direction and for this purpose has an electronic control element 39, a diode 40 and a voltage source 41. Also in the current drain 35, these elements are connected in series, but in parallel opposition to the current drain 34.

The overall current I, flowing through the parallel arrangement comprising the load 30 and the two current drains 34 and 35 is indicated by a signal $I_{ist}$, which is supplied to an adder 51. The adder 51 has further supplied to it externally a signal $I_{soll}$, having a negative sign, which continuously indicates the nominal or desired value of the current for the load 30. The output signal of the adder 51 is supplied on the one hand to an electronic control circuit 52. The electronic control circuit 52 has a further input, to which a control signal $S_I$ is supplied, which indicates the sign of a desired variation or rate of change of overall current with time and hence the required sign or polarity of application of the pulsed supply voltage. The control circuit 52 further has two outputs 53 and 54. The first output 53 is connected through an amplifier 55 to the base of the transistor 15 and moreover through an amplifier 56 and an inverter 57 to the base of the transistor 16. The second output 54 is connected in a corresponding manner through an amplifier 58 to the base of the transistor 17 and through an amplifier 59 and an inverter 60 to the base of the transistor 18.

The output signal of the adder 51 is further supplied to two limiters 61 and 62, whose output signals are supplied to the control elements 36 and 39, respectively, of the current drains 34 and 35, respectively.

The operation of the circuit arrangement shown in FIG. 1 will now be described more fully with reference to the current and voltage diagrams shown in FIGS. 2, 3, 4 and 5.

The capacitance 5 is charged by means of the three-phase transformer 1 and the following rectifier circuit to the direct supply voltage $U_z$. By means of the electronic control circuit 52 or the signals applied to its outputs 53 and 54, respectively, this supply voltage can be switched by means of the transistors 19 to 22 so as to form the voltage U, applied across the series arrangement of the auxiliary inductor 33 and the parallel arrangement of the auxiliary inductor 33 and the parallel combination of the inductive load 30 and the two current drains 34 and 35 in a manner that U, selectively equals zero or the supply voltage $U_z$ applied in a positive or in a negative sense. For application of supply voltage $U_z$ in a positive sense. Conversely, for application of the supply voltage $U_z$ in a negative sense, the transistors 15 and 18 are to be switched to the conductive state.

However, the supply voltage $U_z$ is now not continuously applied, but this takes place in pulsatory form, as indicated in FIG. 2. The overall current $I_1$ flowing through the parallel arrangement is shown therein.

The electronic control circuit 52 must continuously determine the relative distance and the width of the voltage pulses applied to the parallel arrangement. For this purpose, the electronic control circuit 52 has supplied to it the difference signal $I_F$ which indicates the difference between the current actually flowing through the parallel arrangement of the inductive load 30 and the two current drains 34 and 35 and the nominal current through the inductive load 30. This signal $I_F$ therefore indicates the amount by which the current through the parallel arrangement deviates from the nominal current through the load. From this signal $I_F$ and the signal $S_I$ which indicates the sign of the desired variation of the overall current $I_1$ with time and hence the required sign of the pulsed supply voltage, the control circuit 52 determines the polarity, the relative distance and the width of the voltage pulses applied to the parallel arrangement in such a manner that, for time periods in which a constant current $I_{soll}$ flows, the current $I_1$ through the parallel arrangement is always larger than the current $I_{soll}$. In FIG. 3 this holds, for example, for the time interval $t_4$ to $t_5$. During the time of the positive rising edge of the current pulse, i.e. in the time interval $t_1$ to $t_5$ according to FIG. 3, it should further be noted that the current $I_1$ through the parallel arrangement is always larger than the current $I_{soll}$. During the time of the trailing edge of the nominal current of the load, i.e. in the time interval $t_6$ to $t_9$, on the contrary, the polarity, the width and the relative distance of the current pulses are chosen so that the current $I_1$ through the parallel arrangement is always smaller than the current $I_{soll}$.

The overall current $I_1$ consequently flowing through the parallel arrangement assumes a triangular shape, as indicated in FIG. 3. However, in order that not this triangular current $I_1$, but in fact the current $I_{soll}$ is caused to flow through the inductive load 30, the two current drains 34 and 35 are connected parallel to the inductive load.

The current drains 34 and 35 can be controlled by means of the control elements 36 and 39, respectively, that is to say that the value of the current flowing through the current drains can be adjusted by means of these control elements. For this purpose, the signal $I_F$, which is derived in the manner described above, is supplied through limiters 61 and 62, respectively, to the control elements 36 and 39, respectively. These limiters especially serve to supply to the two control elements in the signal $I_1$ with the current respective sign such that when signal $I_F$ is positive the control element 36 is activated and for negative current $I_1$ the control element 39 should be when signal $I_F$ is negative the control element 39 is activated.

This is effected in such a manner that in dependence upon the signal $I_F$ the control element 36 and 39, respectively, is controlled so that accurately the difference current between the current $I_1$ flowing through the parallel arrangement and the nominal current $I_{soll}$ through the load 30 flows through the current drains 34 and 35, respectively. This results in that accurately the nominal current flows through the inductive lead 30.

In the time interval shown in FIGS. 2 to 5, in which a positive current pulse is produced, at the rising edge, i.e. in the time interval $t_1$ to $t_4$, the current drain 36 is activated, while at the falling edge, i.e., in the time interval $t_5$ to $t_9$, the current drain 39 is activated. During the positive constant current flow in the time interval $t_4$ to $t_5$, the current drain 36 is activated. For the time interval $t_1$ to $t_3$, the control operation described above in the circuit arrangement will now be described once more in detail in FIGS. 2 to 4:

At the instant $t_1$ the positive edge of the current $I_{soll}$ through the load 30 begins. Therefore, through the electronic control circuit 52 the positive supply voltage $U_z$ is applied as voltage U, by means of the transistors 17 and 16 to the series arrangement of the auxiliary inductor 33 and the parallel arrangement of the load 30 and the two current drains 34 and 35. Consequently, the current rise shown in FIG. 3 till the instant $t_2$ is obtained, which is considerably higher than the rise of the current $I_{soll}$ in the same time interval. At the instant $t_2$, this application of supply voltage $U_z$ is then switched off so that conditions are obtained wherein voltage $U_1$ i zero. Consequently, the current $I_1$ through the parallel arrangement against slightly decreases. At the instant $t_3$, at which the current $I_1$ must still be larger than the current $I_{soll}$, the supply voltage $U_z$ is again applied to the series arrangement. The operation carried out in the time interval $t_1$ to $t_3$ is then repeated. This also applies to the time interval $t_4$ to $t_5$.

In FIG. 4, the difference current $I_F$ between the nominal current $I_1$ shown in FIG. 3 and the current $I_{soll}$ through the load is represented. By means of the signal $I_F$ indicative of this difference the current drain 36 is activated during the time interval $t_1$ to $t_5$. This is effected under the control of the signal $I_F$ in such a manner that the desired current $I_{soll}$ flows through the load 30. A triangular current having the shape shown in FIG. 4 then flows through the current drain 34.

For the time interval $t_6$ to $t_9$, i.e. during the trailing edge of the current pulse, the overall current $I_1$ must always be smaller than the nominal current $I_{soll}$. At the instant $t_6$, i.e. at the beginning of the trailing edge, at the latest this condition must therefore be satisfied, in the embodiment shown in FIG. 4, this trailing edge is already conditioned even slightly earlier, at the instant $t_5$. This takes place in order that immediately after the instant $t_6$ the current $I_1$ is already smaller than the current $I_{soll}$. At this instant $t_5$, the control circuit 52 receives a signal $S_1$, which anticipates the beginning of a trailing edge. Therefore, by means of the transistors 15 and 18 a negative voltage $U_z$ is applied to the series arrangement. Consequently, the current $I_1$ decreases very rapidly till the instant $t_7$, at which it is already considerably smaller than the current $I_{soll}$. The variation with time of the current $I_1$ in this time interval is considerably larger than the variation with time of the current $I_{soll}$. At the instant $t_7$, the supply voltage is then switched off again so that till the instant $t_8$ the current $I_1$ decreases more slowly. Even before the current $I_1$ reaches again the value of the current $I_{soll}$, the negative supply voltage $U_z$ is again applied to the series arrangement. This operation is then repeated till the end of the negative edge, i.e. till the instant $t_9$.

In the time interval $t_6$ to $t_9$, the signal $I_F$ shown in FIG. 4 is used to control the current drain 39 in the same manner as is the case in this time interval $t_1$ to $t_4$ for the control of the current drain 36. During the time corresponding to the trailing edge of the nominal current $I_{soll}$, the actual current through the load 30 is therefore adjusted to the desired varying amplitude.

For the whole time interval $t_1$ to $t_9$, the variation of the voltage $U_s$ at the overall load, i.e. at the series arrangement of the ohmic resistor 31 and of the inductor 32, is shown in FIG. 5. In the time interval $t_1$ to $t_4$ and $t_6$ to $t_9$, respectively, i.e. in the time intervals of the current variation, this voltage is considerably larger than in the time intervals in which a constant current flows, i.e. for example in the time interval $t_4$ to $t_5$. This is obtained due to the inductive nature of the overall load 30.

I claim:

1. Apparatus for driving a magnetic field coil with a current pulse having a desired current in a leading edge portion and in a trailing edge portion, said apparatus comprising:

a controllable current drain means having a pair of terminals for coupling said field coil in a parallel arrangement with said current drain means;

an inductor coupled at one end to one of said terminals, so as to be in series with said parallel arrangement when the field coil is coupled to said terminals, said inductor, current drain means and field coil thereby comprising a series-parallel arrangement;

means for applying a plurality of temporarily spaced voltage pulses across said series-parallel arrangement in a first polarity during the leading edge portion of said current pulse in a manner to produce a current through said inductor of a greater magnitude than a desired current of said current pulse in said leading edge portion and in a second polarity, opposite to the first polarity, during the trailing edge portion of said current pulse in a manner to produce a current through said inductor of a lesser magnitude than a desired current of said current pulse in said trailing edge portion; and current drain control means for controlling the current drain means to draw the difference between the current through said inductor and the desired current of said current pulse.

2. The arrangement as claimed in claim 1, wherein said means for applying voltage pulses comprises means for forming a DC supply voltage, electronic switch means for selectively applying said DC voltage across said series-parallel arrangement in either said first polarity or said second polarity; and switch control means for controlling said switch means in response to a first control signal indicating the sign of a desired variation of current through the inductor and a second control signal indicating the difference between a measured current through the inductor and the desired current of the current pulse.

3. The arrangement as claimed in claim 2, wherein said current pulse comprises a constant current portion between said leading edge and trailing edge portions, wherein said means for applying voltage pulses is also for applying said voltage pulses in said first polarity during said constant current portion and beginning said applying of voltage pulses in said second polarity a sufficient time prior to the end of the constant current portion that at the very beginning of the trailing edge portion, the current through the inductor substantially equals the desired current of the current pulse.

4. The arrangement as claimed in claim 1, wherein said current drain means comprises a pair of parallel connected activatable current drains, each for when activated drawing current in a different direction, said current drain control means controlling said current drains so that only one of said current drains is activated at a time.

5. The arrangement as claimed in claim 1, further comprising a pair of voltage sources, each in series with a different one of said current drains and polarized to aid in the drawing of current by the current drain with which it is in series.

6. The arrangement as claimed in claim 2, wherein said means for forming a DC supply voltage comprises a Three-phase current transformer having a secondary feeding a rectifier bridge.

7. The arrangement as claimed in claim 2, wherein said current drain means comprises a pair of parallel connected activatable current drains, each for when activated drawing current in a different direction, said current drain control means controlling said current drains so that only one of said current drains is activated at a time.

8. The arrangement as claimed in claim 2, further comprising a pair of voltage sources, each in series with a different one of said current drains and polarized to aid in the drawing of current by the current drain with which it is in series.

9. The arrangement as claimed in claim 3, wherein said current drain means comprises a pair of parallel connected activatable current drains, each for when activated drawing current in a different direction, said current drain control means controlling said current drains so that only one of said current drains is activated at a time.

10. The arrangement as claimed in claim 3, further comprising a pair of voltage sources, each in series with a different one of said current drains and polarized to aid in the drawing of current by the current drain with which it is in series.

* * * * *